(12) United States Patent
Twitto et al.

(10) Patent No.: US 10,333,554 B2
(45) Date of Patent: Jun. 25, 2019

(54) EFFICIENT GENERALIZED TENSOR PRODUCT CODES ENCODING SCHEMES

(71) Applicant: SAMSUNG ELECTRONICS CO., LTD., Suwon-si, Gyeonggi-Do (KR)

(72) Inventors: Moshe Twitto, Ramat Gan (IL); Moshe Ben Ari, Ramat Gan (IL); Avner Dor, Ramat Gan (IL); Elona Erez, Ramat Gan (IL); Jun Jin Kong, Yongin-si (KR); Yaron Shany, Ramat Gan (IL)

(73) Assignee: SAMSUNG ELECTRONICS CO., LTD., Suwon-si, Gyeonggi-Do (KR)

(*) Notice: Subject to any disclaimer, the term of this patent is extended or adjusted under 35 U.S.C. 154(b) by 12 days.

(21) Appl. No.: 15/639,475

(22) Filed: Jun. 30, 2017

(65) Prior Publication Data

US 2019/0007062 A1    Jan. 3, 2019

(51) Int. Cl.
*H03M 13/00*  (2006.01)
*H03M 13/15*  (2006.01)
*H03M 13/29*  (2006.01)

(52) U.S. Cl.
CPC ..... *H03M 13/152* (2013.01); *H03M 13/1515* (2013.01); *H03M 13/2909* (2013.01); *H03M 13/616* (2013.01); *H03M 13/617* (2013.01)

(58) Field of Classification Search
CPC ......... H03M 13/6566; H03M 13/2906; H03M 13/152; G06F 3/0619; G06F 3/065; G06F 3/067; G06F 11/1068; G06F 11/1072; G06F 11/076; G06F 2212/403; G11C 29/52; G11C 11/5642; G11C 2211/5621; G11C 2029/0411; G11C 11/5685; G11C 29/028; G11C 29/021
See application file for complete search history.

*Primary Examiner* — Guerrier Merant
(74) *Attorney, Agent, or Firm* — F. Chau & Associates, LLC

(57) ABSTRACT

A method for generating a binary GTP codeword, comprised of N structure stages and each stage comprises at least one BCH codeword with error correction capability greater than a prior stage and smaller than a next stage, includes: receiving a syndrome vector $\bar{s}$ of a new stage 0 binary BCH codeword $\bar{y}$ over a field $GF(2^m)$ that comprises $\Delta t$ syndromes of length m bits, wherein the syndrome vector $\bar{s}$ comprises l-th Reed-Solomon (RS) symbols of $\Delta t$ RS codewords whose information symbols are delta syndromes of all BCH codewords from stage 0 until stage n−1; and multiplying $\bar{s}$ by a right submatrix $\tilde{U}$ of a matrix U, wherein U is an inverse of a parity matrix of an BCH code defined by $t_n$, wherein the new binary BCH codeword is $\bar{y}=\tilde{U}\cdot\bar{s}$.

19 Claims, 6 Drawing Sheets

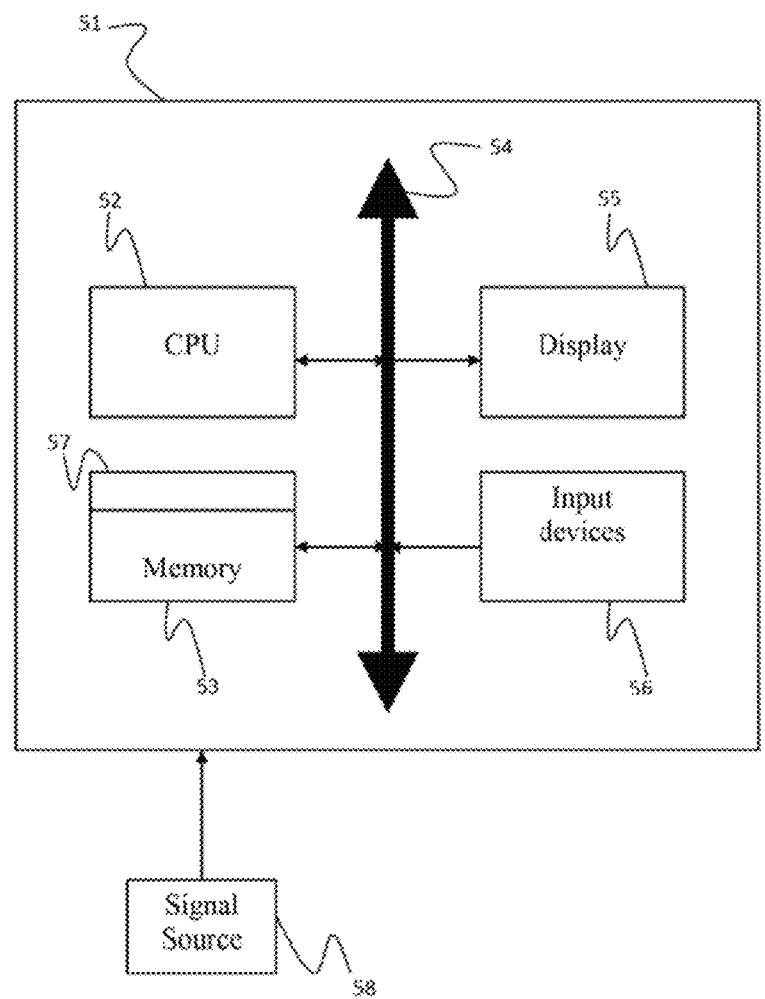

EFFICIENT GENERALIZED TENSOR PRODUCT CODES ENCODING SCHEMES

TECHNICAL FIELD

Embodiments of the present disclosure are directed to methods of forming error correcting codes.

DISCUSSION OF THE RELATED ART

In coding theory, BCH codes form a class of cyclic error-correcting codes that are constructed using finite fields. BCH codes are named for their inventors Raj Bose, D. K. Ray-Chaudhuri, and Alexis Hocquenghern. BCH codes can be defined as follows. Let GF(q) be a finite field, where q is a prime power, and choose positive integers m, n, d, c such that $2 \leq d \leq n$, gcd(n, q)=1, and m is the multiplicative order of q modulo n. Further, let $\alpha$ be a primitive nth root of unity in $GF(q^m)$, and let $m_i(x)$ be the minimal polynomial over GF(q) of $a_i$ for all i. The generator polynomial of the BCH code is the least common multiple $g(x)=lcm(m_c(x), \ldots, m_{c+d-2}(x))$. BCH codes allow a precise control over the number of symbol errors correctable by the code during code design. In particular, it is possible to design binary BCH codes that can correct multiple bit errors. BCH codes can also be easily decoded using an algebraic method known as syndrome decoding. This can simplify the design of the decoder for these codes by using small, low-power electronic hardware.

The syndrome of a received codeword y=x+e, where x is the transmitted codeword and e is an error pattern, is defined in terms of the parity matrix H. The parity check matrix of a linear code C is a generator matrix of the dual code $C^\perp$, which means that a codeword c is in C iff the matrix-vector product Hc=0. Then, the syndrome of the received word y=x+e is defined as S=Hy=H(x+e)=Hx+He=0+He=He. Syndromes are useful in that the message polynomial drops out, and the length of S, the assumed number of errors L, is much less than the length of the codeword x itself.

An exemplary encoding/decoding is depicted in FIG. 1, in which a weak BCH code is given by $C_w \subseteq F_q^n$, the $k_w$ information bits are $x \in F_q^{k_w}$, and the parity check matrix of the weak BCH is $H_w \in F_q^{(n-k_w) \times n}$. A stronger BCH $C_s \subseteq F_q^n$ has parity check matrix $H_s \in F_q^{(n-k_s) \times n}$ given by:

$$H_s = \begin{pmatrix} H_w \\ H_d \end{pmatrix} \in F_q^{(n-k_s) \times n}, \quad (1)$$

where the number of rows of matrix $H_d$ is $(n-k_s)-(n-k_w)=k_w-k_s$, where the subscripts s, w, d respectively refer to strong, weak, and delta. Trivially, the information data $x \in F_q^{k_w}$ can be encoded and decoded with the weak code $C_w \subseteq F_q^n$, and can be encoded and decoded with the strong code $C_s \subseteq F_q^n$, as described herein below.

Information data $x \in F_q^{k_w}$ can be encoded using a BCH code $C_w$ to obtain the codeword $c_w$, as illustrated in FIG. 2. The overhead of the strong code is given by $H_d c_w$ as shown in FIG. 2. This additional overhead may reside on a different page. Note that the overhead stored for a strong code according to an embodiment is not a conventional BCH overhead but $H_d c_w$ instead. However, the overall code is equivalent to a BCH code, as will be shown herein below. This overhead is protected by additional ECC, so that $H_d c_w$ is clean from errors.

A read of $c_w$ with errors yields:

$$y = c_w + e. \quad (2)$$

From y, the syndrome of the weak BCH can be computed:

$$H_w y = H_w e. \quad (3)$$

If the information can be decoded from syndrome, then the decoding is completed, otherwise, compute:

$$H_d y - H_d c_w = H_d c_w + H_d e - H_d c_w = H_d e, \quad (4)$$

since $H_d c_w$ was saved in a protected form. Thus there exist both $H_w e$ and $H_d e$ and therefore, from EQ. (1):

$$H_s e = \begin{pmatrix} H_w \\ H_d \end{pmatrix} e \quad (5)$$

Thus, decoding can be performed using the stronger BCH $C_s$ with parity check matrix $H_s$.

Suppose that a weak BCH has error capability $t_w$ and a strong BCH has error capability $t_s$. Then the weak code uses the syndromes $H_w e$, and the strong BCH requires the syndromes of the weak BCH $H_w e$, as well as additional syndromes $H_d e$. The Beriekamp-Massey (BM) decoder works sequentially on the syndromes, that is, one syndrome after the other. Therefore, if a weak BCH fails, a decoding procedure of the strong BCH can resume from the same point. It will not be necessary to start decoding the strong BCH from the beginning, and it is therefore more efficient. In contrast, other decoding algorithms, such as Euclidian decoding, work simultaneously on all syndromes. Therefore, decoding of weak BCH and strong BCH codes is performed separately, and consequently will be more time consuming.

Another concern in constructing error correcting codes is how to make them simply decodable and efficient. Bose-Chaudhuri-Hocquenguem (BCH) codes are efficient but not simply decodable. On the other hand, majority-logic decodable codes are simply decodable but generally not efficient. A more general class of error-correcting codes, known as Generalized tensor product (GTP) codes, which can be formed by combining a number of codes on various fields with shorter binary codes, has a decoder for bounded distance decoding that is much simpler than the decoders for other codes of comparable or superior quality. GTP codes were introduced by Imai, et al., "Generalized Tensor Product Codes", IEEE Transactions on Information Theory, Vol. IT-27, No. 2, March 1981, pgs. 181-187, the contents of which are herein incorporated by reference in their entirety, and the relevant aspects are summarized as follows.

To construct a GTP code, first define the matrices $H_i$, i=1, 2, ..., $\mu$, and $H_i$, i=1, 2, ..., $\mu$. $H_i$ is an $r_i \times n$ matrix over GF(2) such that the $(r_1+r_2+\ldots+r_1) \times n$ matrix $$M_i = \begin{bmatrix} H_1 \\ H_2 \\ \vdots \\ H_l \end{bmatrix}$$

is a check matrix of a binary (n, $n-r_1-r_2-\ldots-r_l$) code of minimum distance $d_i$. $H_i$ is a $\lambda_i \times v$ matrix over $GF(2^{r_i})$ that is a check matrix of a (v, $v-\lambda_i$) code over $GF(2^{r_i})$ of minimum distance $\delta_i$.

Let $\phi_{kl}^{(i)} \in GF(2^{r_i})$ be the (k, l)th element of $H_i$, k=1, 2, ..., $\lambda_i$, l=1, 2, ..., v. If the matrix representing multiplication by $\phi_{kl}^{(i)}$ according to some fixed basis of $GF(2^{r_i})$ over GF(2) is denoted by $\Phi_{kl}^{(i)}$, then the tensor product of the matrices $H_i$ and $H_i$ is given as $$\mathcal{H}_i = H_i \otimes H_i = \begin{bmatrix} \Phi_{11}^{(i)} H_i & \Phi_{12}^{(i)} H_i & \ldots & \Phi_{1v}^{(i)} H_i \\ \Phi_{21}^{(i)} H_i & & \ldots & \Phi_{2v}^{(i)} H_i \\ \vdots & & & \vdots \\ \Phi_{\lambda_i 1}^{(i)} H_i & \ldots & \ldots & \Phi_{\lambda_i v}^{(i)} H_i \end{bmatrix},$$

$$i = 1, 2, \ldots, \mu.$$

In this expression $\Phi_{kl}^{(i)} H_i$ are $r_i \times n$ matrices of elements from GF(2) and therefore $\mathcal{H}_i$ is an $r_i \lambda_i \times nv$ matrix of elements from GF(2).

A GTP code is defined as a linear code having a check matrix of the form $$\mathcal{H} = \begin{bmatrix} \mathcal{H}_1 \\ \mathcal{H}_2 \\ \vdots \\ \mathcal{H}_\mu \end{bmatrix}$$

The code length N and the number of check bits N−K of a GTP code are given by $$N = nv,$$

$N-K = \sum_{i=1}^{\mu} r_i \lambda_i$. It can be shown that the GTP representation in the background and a GTP representation according to embodiments of the disclosure as described below are mathematically equal and lead to the same code structure.

SUMMARY

An encoding method according to embodiments of the disclosure uses smaller matrices multiplication followed by multi clock partial parallel multiplications instead of single clock full parallel multiplication. Further, a method according to an embodiment separates a single binary matrix multiplication into several smaller matrices multiplication by using polynomial representations and by utilizing BCH code properties.

According to an embodiment of the disclosure, there is provided a computer implemented method for generating a binary Generalized Tensor Product (GTP) codeword, comprised of N structure stages wherein N is an integer greater than 1 and each stage is comprised of at least one BCH codeword with error correction capability greater than a prior stage and smaller than a next stage, the method including: receiving a syndrome vector $\bar{s}$ of a new stage 0 binary BCH codeword $\bar{y}$ over a field $GF(2^m)$ that comprises $\Delta t$ syndromes of length m bits, wherein $\Delta t = t_n - t_0$, $t_0$ is the error correction capability of the stage 0 BCH codeword, $t_n$ is an error correction capability of a stage n BCH codeword to which y will be added, wherein the syndrome vector $\bar{s}$ comprises of l-th Reed-Solomon (RS) symbols of $\Delta t$ RS codewords whose information symbols are delta syndromes of all BCH codewords from stage 0 until stage n−1, wherein l indexes the BCH codeword to which a new binary BCH codeword will be added; and multiplying $\bar{s}$ by a right submatrix $\tilde{U}$ of a matrix U, wherein U is an inverse of a parity matrix of an BCH code defined by $t_n$, wherein the submatrix $\tilde{U}$ is of size $mt_0 \times m\Delta t$, wherein the new binary BCH codeword is $\bar{y} = \tilde{U} \cdot \bar{s}$.

According to a further embodiment of the disclosure, multiplying $\bar{s}$ by right submatrix $\tilde{U}$ of matrix U comprises multiplying each component of the syndrome vector $\bar{s}$ by a component of submatrix $\tilde{U}$ by a binary logic function in a single hardware cycle to yield a component product, wherein submatrix $\tilde{U}$ is calculated before receiving syndrome vector $\bar{s}$ of new binary BCH codeword $\bar{y}$, and multiplexing the component products into a single output that represents the new binary BCH codeword $\bar{y}$.

According to a further embodiment of the disclosure, the syndrome vector $\bar{s}$ is demultiplexed into separate $\tilde{U}$ matrices.

According to a further embodiment of the disclosure, multiplying $\bar{s}$ by right submatrix $\tilde{U}$ of matrix U further includes: multiplying each component of the syndrome vector $\bar{s}$ by a component of reduced submatrix $\tilde{U}'$ by a binary logic function in a single hardware cycle to yield a component product, wherein reduced submatrix defined by $\tilde{U}'(x) = \tilde{U}(x)/g_0(x)$, wherein columns of submatrices $\tilde{U}'$ and $\tilde{U}$ are represented as polynomials and each column of $\tilde{U}'(x)$ is the column of $\tilde{U}(x)$ divided by $g_0(x)$, are calculated before receiving syndrome vector $\bar{s}$ of new binary BCH codeword $\bar{y}$; multiplexing the component products into a temporary output; and convolving the temporary output with a common multiplier $g_0(x)$ to yield the single output that represents the new binary BCH codeword $\bar{y}$, wherein $g_0(x)$ is a common multiplier of all columns of submatrix $\tilde{U}$ represented as polynomials and is calculated before receiving syndrome vector $\bar{s}$ of new binary BCH codeword $\bar{y}$.

According to a further embodiment of the disclosure, the syndrome vector $\bar{s}$ is demultiplexed into separate $\tilde{U}'$ matrices.

According to a further embodiment of the disclosure, convolving the temporary output with a common multiplier $g_0(x)$ is performed over multiple clock cycles.

According to a further embodiment of the disclosure, multiplying $\bar{s}$ by a right submatrix $\tilde{U}$ of a matrix U further includes: calculating a polynomial $h_j(x)$ by multiplying syndrome vector $\bar{s}$ by a matrix $H_j$ formed by concatenating the m polynomials $h_{j,l}$ as columns, wherein polynomials $$h_{j,l}(x) = \overline{U}'_{mj+l}(x)/M_j(x) \text{ and } M_j(x) = \prod_{\substack{i=t_0+1 \\ i \neq j+t_0+1}}^{t_1} m_i(x)$$

wherein $m_i(x)$ is an i-th minimal polynomial of the BCH code $C_1$ with correction capability of $t_1$ and is calculated before receiving syndrome vector $\bar{s}$ of new binary BCH codeword $\bar{y}$; multiplying $h_j(x)$ by $M_j(x)$, and summing over $j=0$ to $\Delta t-1$; multiplexing the sums of the products $h_j(x) \times M_j(x)$ into a temporary output; and convolving the temporary output with a common multiplier $g_0(x)$ to yield the single output that represents the new binary BCH codeword $\bar{y}$, wherein $g_0(x)$ is a common multiplier of all columns of submatrix $\tilde{U}$ represented as polynomials and is calculated before receiving syndrome vector $\bar{s}$ of new binary BCH codeword $\bar{y}$.

According to a further embodiment of the disclosure, the syndrome vector $\bar{s}$ is demultiplexed into separate sets of $H_j$ and $M_j$.

According to a further embodiment of the disclosure, convolving the temporary output with a common multiplier $g_0(x)$ is performed over multiple clock cycles.

According to another embodiment of the disclosure, there is provided a computer processor configured to execute a program of instructions to perform the method steps generating a binary Generalized Tensor Product (GTP) codeword, comprised of N structure stages wherein N is an integer greater than 1 and each stage is comprised of at least one BCH codeword with error correction capability greater than a prior stage and smaller than a next stage, the method including: receiving a syndrome vectors $\bar{s}$ of a new stage 0 binary BCH codeword $\bar{y}$ over a field $GF(2^m)$ that comprises $\Delta t$ syndromes of length m bits, wherein $\Delta t = t_n - t_0$, $t_0$ is the error correction capability of a stage 0 BCH codeword, $t_n$ is an error correction capability of a stage n BCH codeword to which y will be added, wherein the syndrome vector $\bar{s}$ comprises of the l-th Reed-Solomon (RS) symbols of $\Delta t$ RS codewords whose information symbols are delta syndromes of all BCH codewords from stage 0 until stage n−1, wherein l indexes the BCH codeword to which a new binary BCH codeword will be added; and multiplying $\bar{s}$ by a right submatrix $\tilde{U}$ of a matrix U, wherein U is an inverse of a parity matrix of an BCH code defined by $t_n$, wherein the submatrix $\tilde{U}$ is of size $mt_0 \times m\Delta t$, wherein the new binary BCH codeword is $\bar{y} = \tilde{U} \cdot \bar{s}$.

According to a further embodiment of the disclosure, multiplying $\bar{s}$ by right submatrix $\tilde{U}$ of matrix U comprises multiplying each component of the syndrome vector $\bar{s}$ by a component of submatrix $\tilde{U}$ by a binary logic function in a single hardware cycle to yield a component product, wherein submatrix $\tilde{U}$ is calculated before receiving syndrome vector $\bar{s}$ of new binary BCH codeword $\bar{y}$, and multiplexing the component products into a single output that represents the new binary BCH codeword $\bar{y}$.

According to a further embodiment of the disclosure, the syndrome vector $\bar{s}$ is demultiplexed into separate $\tilde{U}$ matrices.

According to a further embodiment of the disclosure, multiplying $\bar{s}$ by right submatrix $\tilde{U}$ of matrix U further includes: multiplying each component of the syndrome vector $\bar{s}$ by a component of reduced submatrix $\tilde{U}'$ by a binary logic function in a single hardware cycle to yield a component product, wherein reduced submatrix defined by $\tilde{U}'(x) = \tilde{U}(x)/g_0(x)$, wherein columns of submatrices $\tilde{U}'$ and $\tilde{U}$ are represented as polynomials and each column of $\tilde{U}'(x)$ is the column of $\tilde{U}(x)$ divided b $g_0(x)$, are calculated before receiving syndrome vector $\bar{s}$ of new binary BCH codeword $\bar{y}$; multiplexing the component products into a temporary output; and convolving the temporary output with a common multiplier $g_0(x)$ to yield the single output that represents the new binary BCH codeword $\bar{y}$, wherein $g_0(x)$ is a common multiplier of all columns of submatrix $\tilde{U}$ represented as polynomials and is calculated before receiving syndrome vector $\bar{s}$ of new binary BCH codeword $\bar{y}$.

According to a further embodiment of the disclosure, the syndrome vector $\bar{s}$ is demultiplexed into separate $\tilde{U}'$ matrices.

According to a further embodiment of the disclosure, convolving the temporary output with a common multiplier $g_0(x)$ is performed over multiple clock cycles.

According to a further embodiment of the disclosure, multiplying $\bar{s}$ by a right submatrix $\tilde{U}$ of a matrix U further includes: calculating a polynomial $h_j(x)$ by multiplying syndrome vector $\bar{s}$ by a matrix $H_j$ formed by concatenating the m polynomials $h_{j,l}$ as columns, wherein polynomials $$h_{j,l}(x) = \tilde{U}'_{mj+l}(x)/M_j(x) \text{ and } M_j(x) = \prod_{\substack{i=t_0+1 \\ i \neq j+t_0+1}}^{t_1} m_i(x)$$

wherein $m_i(x)$ is an i-th minimal polynomial of the BCH code $C_1$ with correction capability of $t_1$ and is calculated before receiving syndrome vector $\bar{s}$ of new binary BCH codeword $\bar{y}$; multiplying $h_j(x)$ by $M_j(x)$, and summing over j=0 to $\Delta t-1$; multiplexing the sums of the products $h_j(x) \times M_j(x)$ into a temporary output; and convolving the temporary output with a common multiplier $g_0(x)$ to yield the single output that represents the new binary BCH codeword $\bar{y}$, wherein $g_0(x)$ is a common multiplier of all columns of submatrix $\tilde{U}$ represented as polynomials and is calculated before receiving syndrome vector $\bar{s}$ of new binary BCH codeword $\bar{y}$.

According to a further embodiment of the disclosure, the syndrome vector $\bar{s}$ is demultiplexed into separate sets of $H_j$ and $M_j$.

According to a further embodiment of the disclosure, convolving the temporary output with a common multiplier $g_0(x)$ is performed over multiple clock cycles.

According to a further embodiment of the disclosure, the computer processor is one or more of an application specific integrated circuit (ASIC), a field programmable gate array (FPGA), and firmware.

BRIEF DESCRIPTION OF THE DRAWINGS

FIG. 7 is a block diagram of a system for efficiently encoding generalized tensor product codes, according to an embodiment of the disclosure.

DETAILED DESCRIPTION OF EXEMPLARY EMBODIMENTS

Figure 1:
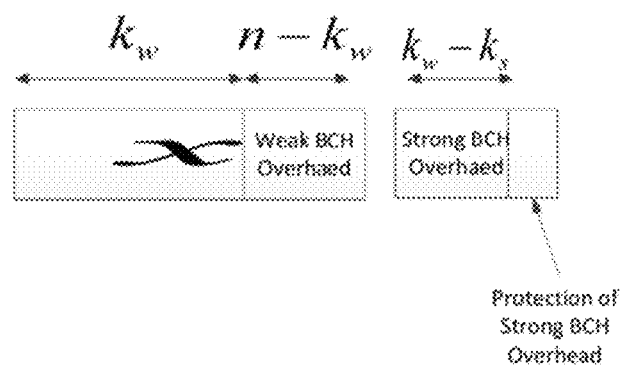
FIG. 1 depicts an exemplary encoding/decoding, according to embodiments of the disclosure.
Figure 2:
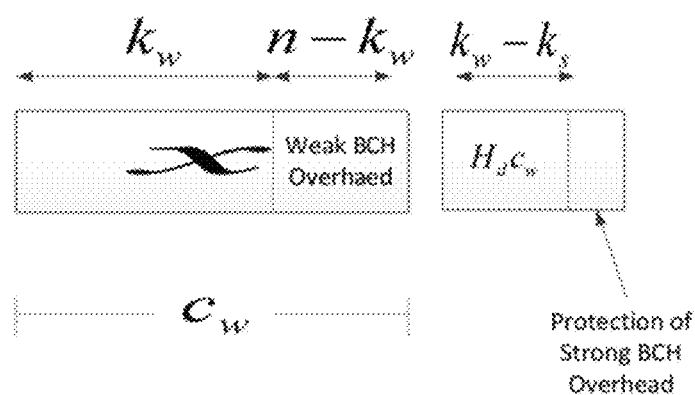
FIG. 2 illustrates information data encoded using a BCH code to obtain a codeword, according to embodiments of the disclosure.

Exemplary embodiments of the disclosure as described herein generally provide systems and methods for efficiently encoding Generalized Tensor Product (GTP) codes. While embodiments are susceptible to various modifications and alternative forms, specific embodiments thereof are shown by way of example in the drawings and will herein be described in detail, it should be understood, however, that there is no intent to limit the disclosure to the particular forms disclosed, but on the contrary, the disclosure is to cover all modifications, equivalents, and alternatives falling within the spirit and scope of the disclosure.

A scheme according to an embodiment of the disclosure for encoding GTP codes concatenates several BCH code words ("frames") with several different correction capabilities, into a single code word, referred to herein as a GTP codeword, where those frames are connected using several Reed Solomon code words to achieve mutual correction capability. A binary sequence added to each frame, i.e., a BCH single code word, to form the connection between the above mentioned BCH code words is referred to herein as a y_vec In GF(2), the binary sequence can be XOR-ed to each frame.

For a linear code C of length n and dimension k over a finite field F, if $H \in F^{(n-k) \times n}$ is a parity-check matrix of C and $y \in F^n$ is some vector, then the syndrome of y with respect to H is defined as $Hy \in F^{n-k}$. Write BCH(m, t) for the primitive binary BCH code of length $2^m-1$ and designed correction radius t. When C is either BCH(m, t) or a shortened BCH(m, t), then typically n−k=mt, so that syndromes are typically of length mt. In fact, for BCH codes, it is useful to calculate syndromes with respect to a very particular parity check matrix. Let $\alpha \in GF(2^m)$ be a primitive element. Let C be as above, and let n be the length of C. For a vector $y=(y_0, \ldots, y_{n-1})^T \in GF(2)^n$, let $y(X):=y_0+y_1X+ \ldots + y_{n-1}X^{n-1}$ be the associated polynomial. For odd $j \in \{1, \ldots, 2t-1\}$, define $S_j:=y(\alpha^j) \in GF(2^m)$. The syndrome of y is defined as $S=S^{(t)}:=(S_1, S_3, \ldots, S_{2t-1})^T$. Note that $y \in C$ if and only if S=0.

Suppose now that there are two correction radii, $t_1 < t_2$. Then for any y, $S^{(t_1)}$ appears as the first $t_1$ entries of $S^{(t_2)}$. The remaining $t_2-t_1$ entries of $S^{(t_2)}$ will be referred to as the delta syndrome vector. Each entry of the delta syndrome vector is referred to as a (single) delta syndrome. Note that when $y \in BCH(m, t_1)$, then the first entries of $t_1$ entries of $S^{(t_2)}$ are zero. Note also that each element of $GF(2^m)$, and in particular each entry of a syndrome, can be represented as an m-bit binary vector once a basis for $GF(2^m)$ over GF(2) is fixed.

Each GTP frame is a BCH frame, and each may have a different correction capability. According to embodiments, $t_i$ is the correction capability of a BCH frame belonging to stage number i, where stage defines a consecutive number of BCH frames with the same correction capability.

A GTP projected encoding scheme according to an embodiment of the disclosure may require that additional data, also referred to herein as projected data, will also be encoded within the BCH frames, along with the information and parity data. This is done by calculating a binary vector, herein called 'y_vec', upon the delta syndrome vector and XOR-ing it with the corresponding BCH frame. The trivial matrices used for y_vec calculation y=·s are large and require a large hardware area, where U will be defined below. Each internal 't' requires its own matrix, which requires more code rates and coding stages, and increases the complexity of an encoder.

According to embodiments, an added y_vec fulfills 3 conditions: (1) It is a BCH code word in the BCH code of the first stage; (2) the calculation of the delta syndrome of a y_vec yields a parity symbol of a Reed-Solomon (RS) code word calculated on the lower stages frames; and (3) y_vec is all zeros on the first $k_i$ bits to maintain systematic structure of the BCH frame, $k_i$ being the number of information bits of the $i^{th}$ BCH frame.

Figure 3:
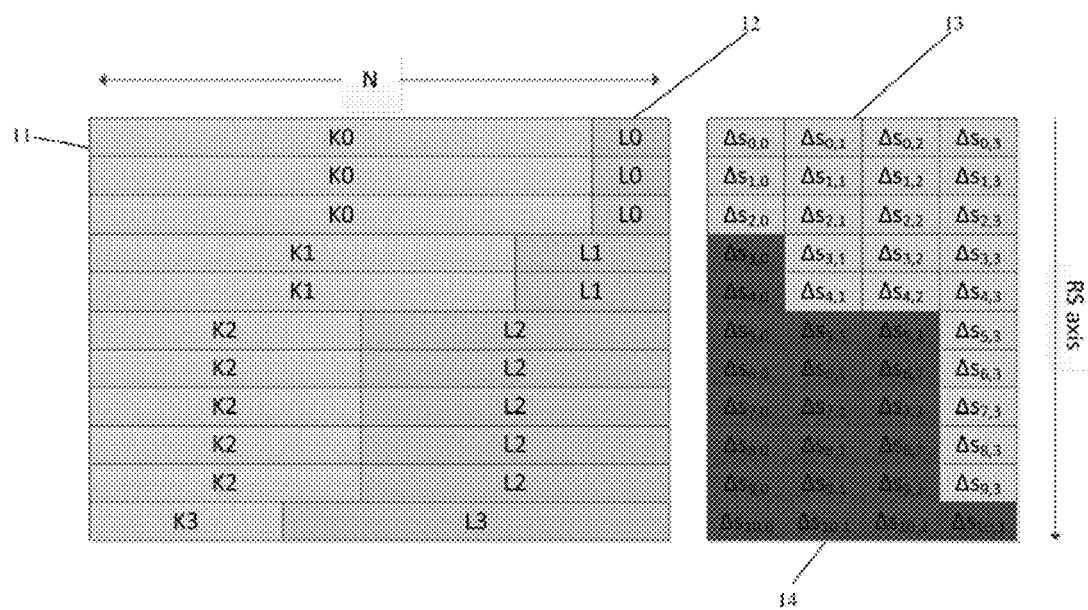
FIG. 3 illustrates exemplary GTP word and delta syndromes (DS) tables, according to embodiments of the disclosure.

FIG. 3 illustrates exemplary GTP word and delta syndromes (DS) tables, according to embodiments of the disclosure. In particular, the left table presents an example of an GTP code word, having 11 frames spanned over 4 stages. Starting from the top of the table, the first 3 frames belong to stage 0, thus each frame is an n-bit BCH code word with a correction capability of $t_0$ bits. Each BCH codeword at this stage comprises $K_0$ information bits 11 and $L_0=mt_0$ parity bits 12. For higher stages, the correction capability is higher and thus there are more parity bits and fewer information bits per frame. Thus, as illustrated in the table, stage 1 has $K_1$ information bits, and $L_1$ parity bits, stage 2 has $K_2$ information bits, and $L_2$ parity bits, and stage 3 has $K_3$ information bits, and $L_3$ parity bits. Note that $K_0 > K_1 > K_2 > K_3$, $L_0 < L_1 < L_2 < L_3$, and that $K_i + L_i = n$ for i=0 to 3. The right table is a delta syndrome (DS) table for those 11 frames. In this example, there are 4 delta syndromes $\Delta S_{ji}$ for each frame, where j is the frame number and i is the delta syndrome number (indices start from zero). The DSs 13 are calculated over the frame, and the DSs 14 are "forced" DSs, calculated by RS (Reed Solomon) encoding. For example, for the first DS there are 3 DSs calculated on the first 3 frames, and those are used as the information of the RS code, which has 8 parity symbols (used as forced DSs for next frames).

According to embodiments, as described above, the input to the y_vec calculator module per frame is a plurality of DSs. A y_vec according to an embodiment can force the frame to which it is added, to be a code word in code $C_0$ with $t_0$ correction capability and to have its DSs comply with the corresponding parity symbols of the RS codes. For a simple structure in which there are only two stages, i.e., frames of code $C_0$ with correction capability $t_0$ and frames of code $C_1$ with correction capability $t_1$, $\Delta t_1 = t_1 - t_0$, this can be viewed as:

$$H_1 \cdot (\bar{x} + \bar{y}) = \begin{bmatrix} H_0 \\ \Delta H_1 \end{bmatrix} \cdot \text{y\_vec} = \begin{pmatrix} 0 \\ \vdots \\ 0 \\ \Delta s_0 \\ \Delta s_1 \\ \vdots \\ \Delta s_{\Delta t_1 - 1} \end{pmatrix} = \begin{pmatrix} 0 \\ \vdots \\ 0 \\ \bar{s} \end{pmatrix}, \quad (1)$$

where the number of rows in $H_0$ is $m \cdot t_0$, the number of rows in $\Delta H_1$ is $m \cdot \Delta t_1$, $\bar{s}$ is a vector of forced delta syndromes, i.e., RS parity symbols, and each $\Delta s$ has m bits. $\bar{x}$ is a code word in $C_1$ and thus has zero syndrome for the entire H matrix, and $\bar{y}$ is only in $C_0$ and thus has zero syndromes for $H_0$, but non-zero delta syndromes for $\Delta H_1$. In addition, adding $\bar{y}$ to $\bar{x}$ does not change the systematic nature of $\bar{x}$ that is, the $\bar{y}$ must be all zeros, except for the last $m \cdot t_1$ bits: $\bar{y}=[0, \ldots, 0, \bar{y}]^T$.

Embodiments of the disclosure can find $\bar{y}$ that comply with the above formula. A method of calculating $\bar{y}$ can find a matrix U that fulfills:

$$U \cdot \begin{pmatrix} 0 \\ \vdots \\ 0 \\ \bar{s} \end{pmatrix} = \tilde{y} \cdot \begin{cases} U: & mt_1 \times mt_1 \\ \bar{s}: & \Delta mt_1 \times 1 \\ \bar{y}: & mt_1 \times 1 \end{cases}. \quad (2)$$

According to an embodiment, a matrix U can be found as follows. First, since a code according to an embodiment is cyclic, there exists a matrix U such that:

$$U \cdot H_1 = [A; I], \quad (3)$$

where I is the identity matrix of size $mt_1 \times mt_1$, A is a matrix of size $mt_1 \times (n-mt_1)$, and the symbol ";" denotes concatenation. Multiplying by U on both left hand sides of EQ. (1) produces the following:

$$U \cdot H_1 \cdot \bar{y} = U \cdot \begin{pmatrix} 0 \\ \vdots \\ 0 \\ \bar{s} \end{pmatrix}.$$

Hence:

$$[A; I] \cdot \bar{y} = U \cdot \begin{pmatrix} 0 \\ \vdots \\ 0 \\ \bar{s} \end{pmatrix},$$

and $$[A; I] \cdot [0, \ldots, 0, \bar{y}]^T = U \cdot \begin{pmatrix} 0 \\ \vdots \\ 0 \\ \bar{s} \end{pmatrix}.$$

It can be seen that A multiplies only zeros, and thus its actual values do not matter, and this equation becomes:

$$I \cdot \tilde{y} = \tilde{y} = U \cdot \begin{pmatrix} 0 \\ \vdots \\ 0 \\ \bar{s} \end{pmatrix},$$

which is the desired result. Going back to EQ. (3), knowing that A is irrelevant, the equation can be formulated as:

$$U \cdot \widetilde{H_1^r} = 1, \quad (4)$$

where $\widetilde{H_1^r}$ is the right most $mt_1 \times mt_1$ submatrix of $H_1$. Thus, according to embodiments, U can be found by inverting the matrix $\widetilde{H_1^r}$.

At this point, the matrix U is an $mt_1 \times mt_1$ binary matrix. According to embodiments, U can be calculated offline, and can be realized in hardware by a network of XOR gates, that is—each bit in the vector $\tilde{y}$ can be generated by xor-ing several bit of $\bar{s}$. However, U may be very large. Taking another look at EQ. (2), it can be seen that U is multiplying $mt_0$ zeros, thus there is no need to hold the full U matrix—it is enough to hold only a matrix $\tilde{U}$ of size $mt_1 \times m\Delta t_1$, which is the right side of U. From HW point of view, this is a reduction of complexity, or more explicitly, a reduction of hardware area (gate count) and power.

$$\tilde{y} = \tilde{U} \cdot \bar{s}. \quad (5)$$

Figure 4:
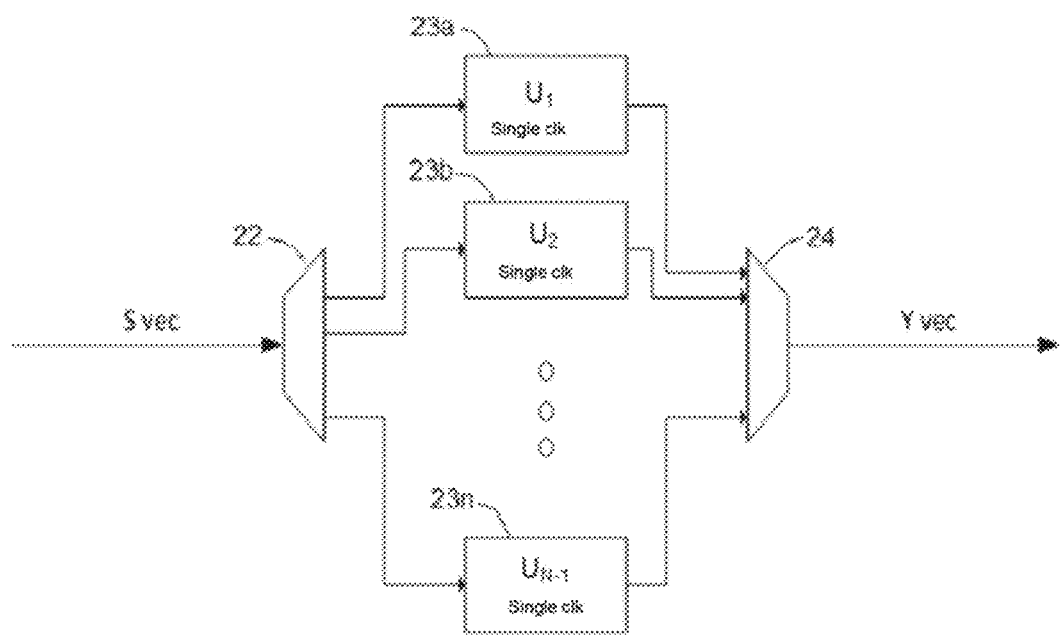
FIG. 4 illustrates an exemplary hardware realization of the y-vec calculation, according to embodiments of the disclosure.

FIG. 4 illustrates an exemplary hardware realization of the y-vec calculation, $\tilde{y} = \tilde{U} \cdot \bar{s}$. For the example in FIG. 3, the first y_vec is calculated for the $4^{th}$ frame, and $\bar{s} = \Delta s_{3,0}$. FIG. 4 is a schematic illustration of a y_vec calculation block. The inputs are the forced DSs, denoted as S_vec, which are de-multiplexed by demultiplexer 22 to different multiplication modules 23a, . . . , 23n according to the current stage, and the outputs from the multiplication modules is multiplexed by multiplexer 24 back to a single output. Note that the S_vec is different for each frame, both by size and by data. Each multiplication module 23a, . . . , 23n is a logic function realizing one component of the matrix multiplication.

According to embodiments, the complexity of EQ. 5 can be further reduced. Since, from EQ. (4), $U \cdot \widetilde{H_1^r} = I$, it can be shown that the following is also valid:

$$\widetilde{H_1^r} \cdot U = I.$$

Since $H_1$ is the syndrome matrix, it can be viewed as "checking" the (zero-padded) columns of U to be code words in code $C_1$. Looking at a single column of U as the coefficients of a polynomial, such a polynomial would be a code word in BCH code $C_1$ if it is a multiplier of all minimal polynomials generating this code. But, since the multiplication $\widetilde{H_1^r} \cdot U$ does not result in zero matrix, (there is a single '1' in each result column), none of the columns of U is a code word in $C_1$. Nevertheless, since every m rows of $H_1$ check if a polynomial is divisible by a specific minimal polynomial, it means that every column of U, treated as a polynomial, is divisible by all minimal polynomials generating the code except a single minimal polynomial. When looking at the multiplication of $\widetilde{H_1^r}$ by $\tilde{U}$, there is the same effect, except the result is a matrix of the form:

$$\widetilde{H_1^r} \cdot \tilde{U} = [0; I]^T.$$

The zero matrix is of size $mt_0 \times m\Delta t_1$, which means that all columns of $\tilde{U}$, treated as polynomials, are multiples of all minimal polynomials up to $t_0$, and of all higher minimal polynomials but one. According to embodiments, the multiplier of all minimal polynomials up to $t_0$ will be referred to as $g_0(x)$, which is a common multiplier of all the columns of $\tilde{U}$. From EQ. (5):

$$\tilde{y} = \tilde{U} \cdot \bar{s} = \Sigma_{k=0}^{m\Delta t_1 - 1} s_k \overline{\tilde{U}_k},$$

where $\overline{\tilde{U}_k}$ is the k-th column of $\tilde{U}$, or in a polynomial representation:

$$\tilde{y}(x) = \Sigma_{k=0}^{m\Delta t_1 - 1} s_k \overline{\tilde{U}_k}(x) = g_0(x) \cdot \Sigma_{k=0}^{m\Delta t_1 - 1} s_k \overline{\tilde{U}'}_k(x), \quad (6)$$

where:

$$\overline{\tilde{U}'}_k(x) = \overline{\tilde{U}'}_k(x)/g_0(x), \quad (7)$$

and as described above, $\overline{\tilde{U}_k}(x)$ is divisible by $g_0(x)$.

So, according to embodiments, the matrix $\tilde{U}$ can be replaced with a new matrix, U', of size $m\Delta t_1 \times m\Delta t_1$, where its columns can be calculated offline using EQ. (7). This matrix has a much reduced complexity relative to U'. To calculate $\tilde{y}$, another multiplication, i.e., a polynomial coefficients convolution, is performed after the multiplication:

$$\tilde{y}(x) = (U' \cdot \bar{s}(x) * g_0(x)$$

The additional convolution can be performed with a very low complexity by multi cycle implementation, thus its added complexity is negligible.

Thus, according to embodiments, the result $\bar{y} = U \cdot \bar{s}$ can be achieved in two phases: (1) tmp=U'·$\bar{s}$; and (2) $\bar{y}$=conv (tmp, $g_{t_0}(x)$). This result has the following properties: (1) the U' matrices are significantly smaller than the original U matrices; (2) $g_{t_0}(x)$ is a polynomial common to all U' matrices; and (3) multiplication by $g_{t_0}(x)$ can also be realized as a matrix, i.e., an XOR gates network. Moreover, multiplication by $g_{t_0}(x)$ can be realized in a multi-cycle format, which enables reuse of a small HW over multiple clock periods, thus further decreasing the matrix size.

Figure 5:
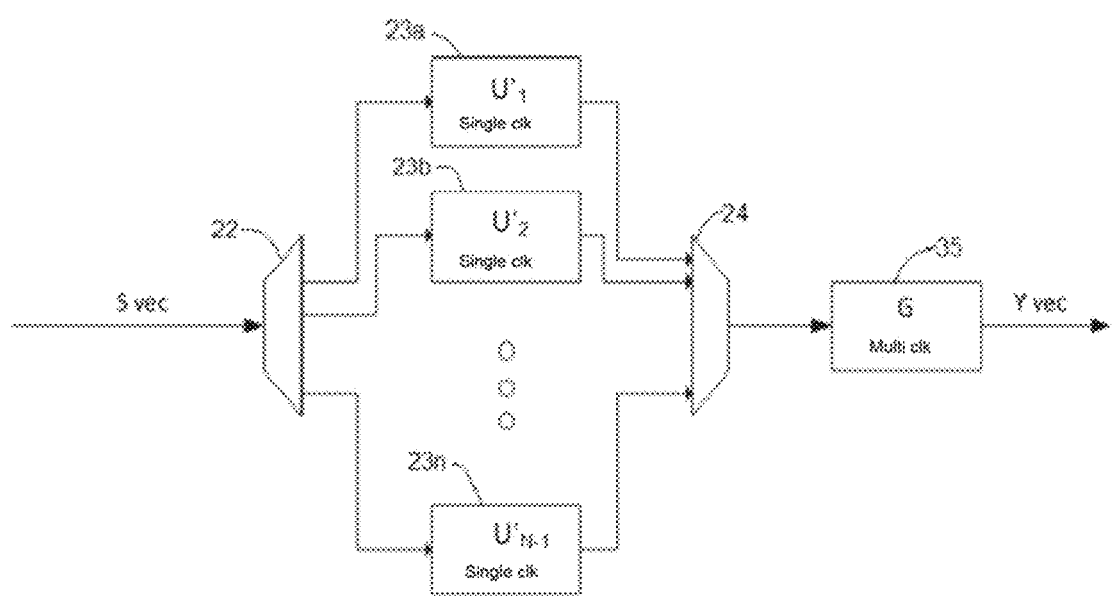
FIG. 5 illustrates an exemplary hardware realization of an embodiment of a y_vec calculation divided into two phases, according to embodiments of the disclosure.

FIG. 5 illustrates an exemplary hardware realization of an embodiment of a y_vec calculation divided into two phases as described above. The hardware configuration of FIG. 5 is substantially similar to that of FIG. 4, and thus only differences between the configurations will be described. The output of the demultiplexor 24 is tmp, and a convolution $\bar{y}=\text{conv}(\text{tmp}, g_{t_0}(x))$ according to an embodiment is implemented by the block 35. A convolution according to an embodiment is a finite impulse response (FIR) filter, and thus can be performed in several clock cycles using a state (memory) register, instead of in a single clock cycle, which enables using a smaller logic function.

Embodiments of the disclosure utilize only the zero part of $\widetilde{H}_1 \cdot \tilde{U}$. However, as described above, since the result is of the form $[0; I]^T$, there exist more common characteristics of the result columns: every batch of m columns is a multiplier of $g_0(x)$, as above, but also of all other minimal polynomials, except one. According to embodiments, this can be formulated as follows:

$$\tilde{y}(x) = \sum_{k=0}^{m\Delta t_1 - 1} s_k \bar{U}_k(x),$$

$$= g_0(x) \cdot \sum_{j=0}^{\Delta t_1 - 1} \sum_{l=0}^{m-1} s_{j,l} \cdot M_j(x) \cdot h_{j,l}(x) = g_0(x) \cdot \sum_{j=0}^{\Delta t_1 - 1} M_j(x) \sum_{l=0}^{m-1} s_{j,l} \cdot h_{j,l}(x),$$

where $s_{j,l}$ is defined as the $s_{mj+l}$, the m-th bit in the J-th delta syndrome, $$M_j(x) = \prod_{\substack{i=t_0+1 \\ i \neq j+t_0+1}}^{t_1} m_i(x),$$

$m_i(x)$ is the i-th minimal polynomial and $h_{j,l}(x) = \bar{U}_{mj+l}(x)/M_j(x)$. As before, all of the polynomials $h_{j,l}(x)$ and $M_j(x)$ can be calculated offline.

According to embodiments, by defining an m×m matrix $H_j$ to be the concatenation of the m polynomials $h_{j,l}$, l=0, . . . , m−1 as columns, it can be seen that:

$$\Sigma_{l=0}^{m-1} s_{j,l} \cdot h_{j,l}(x) = H_j \cdot \bar{s}_j = h_j(x),$$

and a final formula according to an embodiment is obtained:

$$\tilde{y}(x) = g_0(x) \cdot \Sigma_{j=0}^{\Delta t_1 - 1} M_j(x) \cdot h_j(x).$$

According to another embodiment of the disclosure, a calculation has been divided into three phases:
1. Calculating $h_j(x)$,
2. Multiplying by $M_j(x)$ and summing,
3. Multiplying by $g_0(x)$.

In a first section, each delta syndrome is multiplied by its own offline calculated matrix $H_j$. A third section is exactly as described in an embodiment as illustrated in FIG. 5. A second section according to another embodiment combines both multiplication and summation. Note that each hardware stage requires its own H and M matrices, for all delta syndromes that participate in that stage. That is, there is a different hardware for DSI when it is used in stage i and j. The multiplication of two polynomials represented by coefficient vectors can be implemented in a multi cycle operation as follows:

$$h(x) = h^{n-1}x^{n-1} + ah_{n-2}x^{n-2} + \ldots + h_1 x + h_0,$$

and $$h(x) \cdot M(x) = h_0 \cdot M(x) + x \cdot h_1 \cdot M(x) + \ldots + h_{n-1} x^{n-1} \cdot M(x).$$

Since for binary polynomials, multiplication by $x^j$ is a shift left by j, the multiplication of the two polynomials can be realized as adding each bit of one polynomial multiplied by the other polynomial with the corresponding shift. Thus if the coefficient of $x^{m-1}$ (MSB) of $h_j(x)$ is multiplied by $M_i(x)$ in the first cycle, and it is added to the bit that was right-shifted by one bit in the multiplication of the coefficient of $x^{m-2}$ of $h_j(x)$ by $M_j(x)$ in the second cycle, and so on, the result of $M_j(X) \cdot h_i(x)$ is obtained. Since a sum over j is desired, the same can be performed in a matrix format, that is—define a matrix G which is a concatenation of all $M_j$ as columns, and in each cycle i, over in cycles, multiply G by a vector $\bar{v}_i = [h_0^{(i)}, h_1^{(i)}, \ldots, h_{\Delta t_2-1}^{(i)}]^T$ and add it to the result shifted by i bits to the right, where $h_j^{(i)}$ is defined as the coefficient of $x^i$ of (x).

Figure 6:
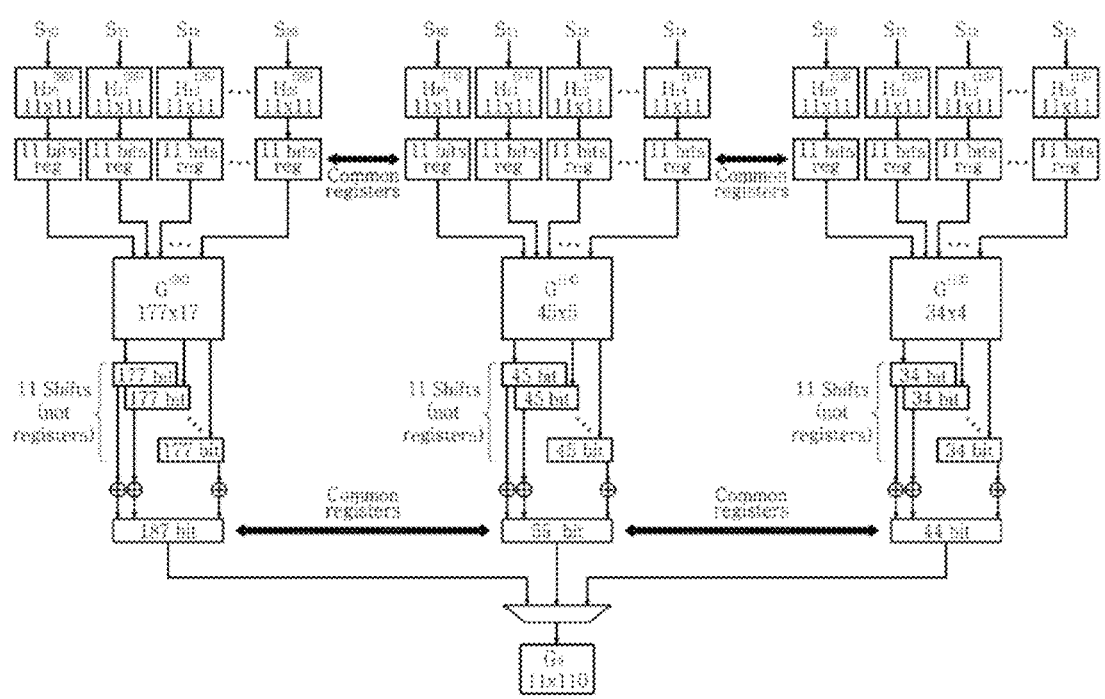
FIG. 6 illustrates an exemplary hardware realization of an embodiment of a y_vec calculation divided into three phases, according to embodiments of the disclosure.

FIG. 6 illustrates an exemplary hardware realization of an embodiment of a y_vec calculation divided into three phases as described above. However, embodiments of the disclosure can encompass any number of phases. In the figure, N is the number of stages, m is the binary BCH code over $GF(2^m)$, and $dt_n = t_n - t_0$. In addition, for clarity, only blocks on the left-hand side have reference numbers. The figure depicts a HW configuration where multiplication by G is done in m cycles, where the input for each cycle is one bit from each register, and the bits are chosen according to the cycle number. For each cycle, the output bits are summed with one shift relative to a previous cycle. Referring to the figure, blocks 41 represent the components of each of $dt_{N-1}$ syndrome vectors, blocks 42 represents the sums $\Sigma_{l=0}^{m-1} s_{j,l} \cdot h_{j,l}(x) = H_j \cdot \bar{s}_j = h_j(x)$, whose output is stored in registers 43, blocks 44 and represent the sums $\Sigma_{j=0}^{\Delta t_1 - 1} M_j(x) \cdot h_j(x)$ with the m shifts, as discussed above, whose results are summed and stored in registers 46, block 47 is a multiplexer, and block 48 represents the final multiplication by $g_0(x)$, which, as described above, may be done in multi cycle operation.

System Implementations

It is to be understood that embodiments of the present disclosure can be implemented in various forms of hardware, software, firmware, special purpose processes, or a combination thereof in one embodiment, the present disclosure can be implemented in hardware as an application-specific integrated circuit (ASIC), or as a field programmable gate array (FPGA). In another embodiment, the present disclosure can be implemented in software as an application program tangible embodied on a computer readable program storage device. The application program can be uploaded to, and executed by, a machine comprising any suitable architecture.

FIG. 7 is a block diagram of a system for efficiently encoding generalized tensor product codes, according to an embodiment of the disclosure. Referring now to FIG. 7, a computer system 51 for implementing an embodiment of the present disclosure can comprise, inter alia, a central processing unit (CPU) 52, a memory 53 and an input/output (I/O) interface 54. The computer system 51 is generally coupled through the I/O interface 54 to a display 55 and various input devices 56 such as a mouse and a keyboard. The support circuits can include circuits such as cache, power supplies, clock circuits, and a communication bus. The memory 53 can include random access memory (RAM), read only memory (ROM), disk drive, tape drive, etc., or a combinations thereof. The present disclosure can be implemented as a routine 57 that is stored in memory 53 and executed by the CPU 52 to process the signal from the signal source 58. As such, the computer system 51 is a general purpose computer system that becomes a specific purpose computer system when executing the routine 57 of the present disclosure. Alternatively, as described above, embodiments of the present disclosure can be implemented as an ASIC or FPGA 57 that is in signal communication with the CPU 52 to process the signal from the signal source 58.

The computer system 51 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which an embodiment of the present disclosure is programmed. Given the teachings of the present disclosure provided herein, one of ordinary skill in the related art will be able to contemplate these and similar implementations or configurations of the present disclosure.

While embodiments of the present disclosure has been described in detail with reference to exemplary embodiments, those skilled in the art will appreciate that various modifications and substitutions can be made thereto without departing from the spirit and scope of the disclosure as set forth in the appended claims.

What is claimed is:

1. A computer implemented method for generating a binary Generalized Tensor Product (GTP) codeword, comprised of N structure stages wherein N is an integer greater than 1 and each stage is comprised of at least one BCH codeword with error correction capability greater than a prior stage and smaller than a next stage, the method executed by the computer comprising the steps of:

receiving new stage 0 binary BCH codeword $\bar{y}$ over a field $GF(2^m)$ from a communication channel;

receiving a syndrome vector $\bar{s}$ of the new stage 0 binary BCH codeword $\bar{y}$ that comprises $\Delta t$ syndromes of length m bits, wherein $\Delta t = t_n - t_0$, $t_0$ is the error correction capability of the stage 0 BCH codeword, $t_n$ is an error correction capability of a stage n BCH codeword to which a new binary BCH codeword $\bar{y}$ will be added, wherein the syndrome vector $\bar{s}$ comprises l-th Reed-Solomon (RS) symbols of $\Delta t$ RS codewords whose information symbols are delta syndromes of all BCH codewords from stage 0 until stage n−1, wherein l indexes the BCH codeword to which $\bar{y}$ will be added; and multiplying $\bar{s}$ by a right submatrix $\tilde{U}$ of a matrix U, wherein U is an inverse of a parity matrix of an BCH code defined by $t_n$, wherein the submatrix $\tilde{U}$ is of size $mt_0 \times m\Delta t$, wherein the new binary BCH codeword is $\bar{y} = \tilde{U} \cdot \bar{s}$.

2. The method of claim 1, wherein multiplying $\bar{s}$ by right submatrix $\tilde{U}$ of matrix U comprises multiplying each component of the syndrome vector $\bar{s}$ by a component of submatrix $\tilde{U}$ by a binary logic function in a single hardware cycle to yield a component product, wherein submatrix $\tilde{U}$ is calculated before receiving syndrome vector $\bar{s}$ of new binary BCH codeword $\bar{y}$, and multiplexing the component products into a single output that represents the new binary BCH codeword $\bar{y}$.

3. The method of claim 2, wherein the syndrome vector $\bar{s}$ is demultiplexed into separate $\tilde{U}$ matrices.

4. The method of claim 1, wherein multiplying $\bar{s}$ by right submatrix $\tilde{U}$ of matrix U further comprises:

multiplying each component of the syndrome vector $\bar{s}$ by a component of reduced submatrix $\tilde{U}'$ by a binary logic function in a single hardware cycle to yield a component product, wherein reduced submatrix defined by $\tilde{U}'(x) = \tilde{U}(x)/g_0(x)$, wherein columns of submatrices $\tilde{U}'$ and $\tilde{U}$ are represented as polynomials and each column of $\tilde{U}'(x)$ is the column of $\tilde{U}(x)$ divided by $g_0(x)$, are calculated before receiving syndrome vector $\bar{s}$ of new binary BCH codeword $\bar{y}$;

multiplexing the component products into a temporary output; and convolving the temporary output with a common multiplier $g_0(x)$ to yield the single output that represents the new binary BCH codeword $\bar{y}$, wherein $g_0(x)$ is a common multiplier of all columns of submatrix $\tilde{U}$ represented as polynomials and is calculated before receiving syndrome vector $\bar{s}$ of new binary BCH codeword $\bar{y}$.

5. The method of claim 4, wherein the syndrome vector s is demultiplexed into separate $\tilde{U}'$ matrices.

6. The method of claim 4, wherein convolving the temporary output with a common multiplier $g_0(x)$ is performed over multiple clock cycles.

7. The method of claim 1, wherein multiplying $\bar{s}$ by a right submatrix $\tilde{U}$ of a matrix U further comprises:

calculating a polynomial $h_j(x)$ by multiplying syndrome vector $\bar{s}$ by a matrix $H_j$ formed by concatenating the m polynomials $h_{j,l}$ as columns, wherein polynomials $$h_{j,l}(x) = \overline{U}'_{mj+l}(x)/M_j(x) \text{ and } M_j(x) = \prod_{\substack{i=t_0+1 \\ i \neq j+t_0+1}}^{t_1} m_i(x)$$

$m_i(x)$ wherein $m_i(x)$ is an i-th minimal polynomial of the BCH code $C_1$ with correction capability of $t_1$ and is calculated before receiving syndrome vector $\bar{s}$ of new binary BCH codeword $\bar{y}$;

multiplying $h_j(x)$ by $M_j(x)$, and summing over j=0 to $\Delta t-1$;

multiplexing the sums of the products $h_j(x) \times M_j(x)$ into a temporary output; and convolving the temporary output with a common multiplier $g_0(x)$ to yield the single output that represents the new binary BCH codeword $\bar{y}$, wherein $g_0(x)$ is a common multiplier of all columns of submatrix $\tilde{U}$ represented as polynomials and is calculated before receiving syndrome vector $\bar{s}$ of new binary BCH codeword $\bar{y}$.

8. The method of claim 7, wherein the syndrome vector $\bar{s}$ is demultiplexed into separate sets of $H_j$ and $M_j$.

9. The method of claim 7, wherein convolving the temporary output with a common multiplier $g_0(x)$ is performed over multiple clock cycles.

10. A computer processor configured to execute a program of instructions to perform the method steps generating a binary Generalized Tensor Product (GTP) codeword, comprised of N structure stages wherein N is an integer greater than 1 and each stage is comprised of at least one BCH codeword with error correction capability greater than a prior stage and smaller than a next stage, the method comprising the steps of:

receiving new stage 0 binary BCH codeword $\bar{y}$ over a field $GF(2^m)$ from a communication channel;

receiving a syndrome vector $\bar{s}$ of the new stage 0 binary BCH codeword $\bar{y}$ that comprises $\Delta t$ syndromes of length m bits, wherein $\Delta t = t_n - t_0$, $t_0$ is the error correction capability of the stage 0 BCH codeword, $t_n$ is an error correction capability of a stage n BCH codeword to which a new binary BCH codeword $\bar{y}$ will be added, wherein the syndrome vector $\bar{s}$ comprises l-th Reed-Solomon (RS) symbols of $\Delta t$ RS codewords whose information symbols are delta syndromes of all BCH codewords from stage 0 until stage n−1, wherein l indexes the BCH codeword to which $\bar{y}$ will be added; and multiplying $\bar{s}$ by a right submatrix $\tilde{U}$ of a matrix U, wherein U is an inverse of a parity matrix of an BCH code defined by $t_n$, wherein the submatrix $\tilde{U}$ is of size $mt_0 \times m\Delta t$, wherein the new binary BCH codeword is $\bar{y} = \tilde{U} \cdot \bar{s}$.

11. The computer processor of claim 10, wherein multiplying $\bar{s}$ by right submatrix $\tilde{U}$ of matrix U comprises multiplying each component of the syndrome vector $\bar{s}$ by a component of submatrix $\tilde{U}$ by a binary logic function in a single hardware cycle to yield a component product, wherein submatrix $\tilde{U}$ is calculated before receiving syndrome vector $\bar{s}$ of new binary BCH codeword $\bar{y}$, and multiplexing the component products into a single output that represents the new binary BCH codeword $\bar{y}$.

12. The computer processor of claim 11, wherein the syndrome vector $\bar{s}$ is demultiplexed into separate $\tilde{U}$ matrices.

13. The computer processor of claim 10, wherein multiplying $\bar{s}$ by right submatrix $\tilde{U}$ of matrix U further comprises:

multiplying each component of the syndrome vector $\bar{s}$ by a component of reduced submatrix $\tilde{U}'$ by a binary logic function in a single hardware cycle to yield a component product, wherein reduced submatrix defined by $\tilde{U}'(x) = \tilde{U}(x)/g_0(x)$, wherein columns of submatrices $\tilde{U}'$ and $\tilde{U}$ are represented as polynomials and each column of $\tilde{U}'(x)$ is the column of $\tilde{U}(x)$ divided by $g_0(x)$, are calculated before receiving syndrome vector $\bar{s}$ of new binary BCH codeword $\bar{y}$;

multiplexing the component products into a temporary output; and convolving the temporary output with a common multiplier $g_0(x)$ to yield the single output that represents the new binary BCH codeword $\bar{y}$, wherein $g_0(x)$ is a common multiplier of all columns of submatrix $\tilde{U}$ represented as polynomials and is calculated before receiving syndrome vector $\bar{s}$ of new binary BCH codeword $\bar{y}$.

14. The computer processor of claim 13, wherein the syndrome vector $\bar{s}$ is demultiplexed into separate $\tilde{U}'$ matrices.

15. The computer processor of claim 13, wherein convolving the temporary output with a common multiplier $g_0(x)$ is performed over multiple clock cycles.

16. The computer processor of claim 10, wherein multiplying $\bar{s}$ by a right submatrix $\tilde{U}$ of a matrix U further comprises:

calculating a polynomial $h_j(x)$ by multiplying syndrome vector $\bar{s}$ by a matrix $H_j$ formed by concatenating the m polynomials $h_{j,l}$ as columns, wherein polynomials $$h_{j,l}(x) = \overline{U}'_{mj+l}(x)/M_j(x) \text{ and } M_j(x) = \prod_{\substack{i=t_0+1 \\ i \neq j+t_0+1}}^{t_1} m_i(x)$$

wherein $m_i(x)$ is an i-th minimal polynomial of the BCH code $C_1$ with correction capability of $t_1$ and is calculated before receiving syndrome vector $\bar{s}$ of new binary BCH codeword $\bar{y}$;

multiplying $h_j(x)$ by $M_j(x)$, and summing over j=0 to $\Delta t−1$;

multiplexing the sums of the products $h_j(x) \times M_j(x)$ into a temporary output; and convolving the temporary output with a common multiplier $g_0(x)$ to yield the single output that represents the new binary BCH codeword $\bar{y}$, wherein $g_0(x)$ is a common multiplier of all columns of submatrix $\tilde{U}$ represented as polynomials and is calculated before receiving syndrome vector $\bar{s}$ of new binary BCH codeword $\bar{y}$.

17. The computer processor of claim 16, wherein the syndrome vector $\bar{s}$ is demultiplexed into separate sets of $H_j$ and $M_j$.

18. The computer processor of claim 16, wherein convolving the temporary output with a common multiplier $g_0(x)$ is performed over multiple clock cycles.

19. The computer processor of claim 10, wherein the computer processor is one or more of an application specific integrated circuit (ASIC), a field programmable gate array (FPGA), and firmware.

* * * * *